(12) United States Patent
Harrison et al.

(10) Patent No.: US 6,401,461 B1
(45) Date of Patent: Jun. 11, 2002

(54) COMBINATION ICE-MAKER AND COOLER

(76) Inventors: Howard R. Harrison; Jeffrey R. Brown, both c/o Harrison/Brown Engineering 1302 Martley Dr., Mississauga, Ontario (CA), L5H 1N9

( * ) Notice: Subject to any disclaimer, the term of this patent is extended or adjusted under 35 U.S.C. 154(b) by 0 days.

(21) Appl. No.: 09/522,929

(22) Filed: Mar. 10, 2000

Related U.S. Application Data

(60) Provisional application No. 60/123,655, filed on Mar. 10, 1999, and provisional application No. 60/140,438, filed on Jun. 23, 1999.

(51) Int. Cl.⁷ .................................................. F25B 21/02
(52) U.S. Cl. .......................................... 62/3.61; 62/3.63
(58) Field of Search .................................. 62/3.61, 3.62, 62/3.63, 237, 437, 438

(56) References Cited

U.S. PATENT DOCUMENTS

| | | | | |
|---|---|---|---|---|
| 2,943,452 A | * | 7/1960 | Buchanan | 62/3.61 |
| 3,733,836 A | * | 5/1973 | Corini | 62/3.61 |
| 4,328,676 A | * | 5/1982 | Reed | 62/3.62 |
| 4,823,554 A | * | 4/1989 | Trachtenburg et al. | 62/3.62 |
| 4,913,713 A | * | 4/1990 | Bender et al. | 62/3.61 |
| 4,951,481 A | * | 8/1990 | Negishi | 62/438 |
| 5,022,315 A | * | 6/1991 | Bertram et al. | 62/437 |
| 5,247,798 A | * | 9/1993 | Collard, Jr. | 62/3.62 |
| 5,524,440 A | * | 6/1996 | Nishioka et al. | 62/3.62 |

* cited by examiner

*Primary Examiner*—William E. Tapolcai
(74) *Attorney, Agent, or Firm*—Ridout & Maybee LLP

(57) ABSTRACT

A compact combination ice maker and cooler is taught which is capable of maintaining a uniform freezing or cooling temperature across the surface of a heat conductive liner continuous over bottom liner wall and, front, rear, and side walls. Also taught is a means to provide an intermediate heat sink to assist in maintaining the uniform freezing or cooling temperature upon the introduction of a new thermal load, and a means to provide a small forward voltage when the thermoelectric module is turned off in order to prevent the back flow of heat through the thermoelectric module. Also taught is a cooler with a combination beverage inspection/dispensing door located proximal to the bottom of said front and with inside walls adapted to form a beverage stack and contoured to maintain improved thermal communication with the bottommost beverage can.

8 Claims, 10 Drawing Sheets

COMBINATION ICE-MAKER AND COOLER

CROSS REFERENCE TO RELATED APPLICATIONS

This application claims priority from U.S. patent application Ser. No. 60/123,655, filed Mar. 10, 1999 and from U.S. patent application Ser. No. 60/140,438, filed Jun. 23, 1999, which applications are pending.

FIELD OF THE INVENTION

This invention relates to a thermoelectric cooler for making ice or frozen treats or for cooling a relatively small amount of food or beverage.

BACKGROUND OF THE INVENTION

A thermoelectric ice maker for making molded ice blocks is described and claimed in U.S. Pat. No. 4,587,810 issued May 13, 1986, to Fletcher and in U.S. Pat. No. 4,487,024 issued Dec. 11, 1984 to Fletcher et al. The ice maker described in U.S. Pat. No. 4,587,810 uses a shallow heat conductive tray, i.e., a metal tray, to hold a flexible bag having individual compartments as mould compartments for ice blocks. The shallow walls of the tray are surrounded with insulation and the lid of the ice maker which covers the tray immediately above the freezer bag is also insulated. The bottom of the tray is cooled with a plurality of thermoelectric elements.

Thermoelectric units have low cooling rates and are able to maintain only a limited hot surface/cold surface temperature differential. Condensation around thermocouples can be a problem. Providing a cost effective unit of this type that provides efficient freezing and cooling would be very desirable. Further, a unit that is subject to minimum condensation and in which means are provided to remove any condensation to a location where it will not cause later problems such as deterioration of the semiconductor materials or short circuiting of electric circuits would be very desirable from a long term standpoint.

It is believed that an attempt has been made in the ice maker of U.S. Pat. No. 4,578,810 and U.S. Pat. No. 4,487,024 to overcome these problems but it is believed that, because the thermoelectric elements are placed under the cooling tray, natural convection will not enhance the action of fans dissipating heat withdrawn from the tray. This fact appears to have been recognized by the inventor since he tilts his tray at an angle to the horizontal for various stated reasons. No particular measures appear to have been taken to reduce condensation.

It would also be very desirable that a small scale and cost effective freezer for use, for example, in individual rooms in offices, hotels, cars, etc., might also be capable of providing ice blocks of various sizes in bags or other forms, frozen treats, or a small number of individual cooled beverages. The inventor of U.S. Pat. No. 4,587,810 and U.S. Pat. No. 4,487,024 has not attempted to provide any cooling compartment sufficiently deep and spacious that freezing of various shapes and formats of ice blocks or frozen treats and cooling of beverages or small amounts of other food substances may be contemplated. Nor have they attempted to provide a dual purpose device which is capable of uniformly freezing a plurality of ice blocks or uniformly cooling one or more single serving beverages while providing a means to prevent the latter from freezing.

SUMMARY OF THE INVENTION

The present inventors have attempted to devise a compact, multipurpose ice maker/cooler of small size suitable for use by individuals at convenience locations. Moreover the present inventors have attempted to provide such a cooler utilizing a minimum number of thermoelectric elements to minimize initial cost of the device and to minimize running expenses. The present inventors have recognized the desirability of maintaining a uniform cooling temperature within the ice maker/cooler. It has not previously been thought possible to provide uniform temperature within a thermoelectric cooler when utilizing only one thermoelectric element. Moreover, in coolers of small size problems of uniform temperature and rapid cooling of freshly inserted contents are greater than in larger coolers.

In addition, the present inventors have recognized the desirability of keeping the hot side (or heat sink) of the thermoelectric module at or very close to ambient in order to take full advantage of the limited temperature differential available from the thermoelectric module.

A further problem exists concerning the heat sink. When the cooler is turned off there is a tendency for heat to flow back into the cooler. The present inventors have also addressed this problem.

Accordingly the present invention provides a compact multipurpose ice making cooler comprising a box having an insulated front compartment having an insulated compartment lid and a heat conductive liner continuous over a bottom liner wall and front, rear and side liner walls, the liner defining a cold chamber having a height greater than the distance between the front and rear liner walls; a thermoelectric module for cooling the liner, the module being in thermal communication, on the one hand, with the liner and, on the other hand, with a heat sink to dissipate heat from the liner, the module and heat sink being located behind the rear liner wall such that natural convection tends to dissipate said heat, the heat sink projecting into a rear compartment having air vents to the exterior; a fan in the rear compartment to supplement dissipation of said heat; a thermistor to continuously monitor operation of the thermoelectric module; and a dual set point controller with built-in hysteresis to control the temperature within the cooler in dependence on one of two preset desired temperatures depending on the position of a user activated slide switch.

The thermoelectric module may be spaced from the rear wall of the liner by a spacer block, the spacer block and the module being imbedded in insulation on the rear wall, and sealed to prevent the ingress of condensation.

The heat sink advantageously comprises a vertical bank of horizontal fins projecting rearwardly into the rear compartment. A front face of the bank of fins may lie flush with the insulation on the rear wall of the front compartment and in thermal contact with the thermoelectric module.

The liner may advantageously be formed of ¼ inch aluminum plate or other material suitable for good thermal conductivity and the thermistor is advantageously located on one of the side walls or the front wall so that it controls the temperature at a distance from the thermoelectric module.

In order to minimize sudden rise in temperature within the cooler when fresh, unfrozen, contents are inserted, a thermal ballast may be used. The thermal ballast may be located outside the cooling chamber and inside the insulation. It may be any high specific heat material e.g. a thermal gel confined around the cooling chamber or maybe a block, or blocks, of thermal gel material contacting the outer surface of the cooling container within the insulation. Other materials such as blocks of aluminum (possibly embodied as a thickened cold chamber wall over all or part of its surface), other metals, other liquids e.g. water or alcohol solutions may also be used. However practical considerations such as ease of achieving good thermal transfer with the cold chamber, ability to easily adapt to the shape of any cavity between the cold chamber and the insulation, cost, weight, and leakage and environmental considerations must be taken into account. While the thermal ballast is described herein as it relates to the present ice maker/cooler, one skilled in the art will appreciate that the thermal ballast can be advantageously applied to many similar apparatus such as any thermoelectric or traditionally chilled freezer or cooler to improve its thermal stability.

Means may be provided to maintain the fan running for a period after the thermoelectric module is turned off to dissipate heat within the heat sink into the ambient air, thereby reducing the temperature of the heat sink and the temperature differential between the heat sink and the cold chamber. This will reduce the natural flow of heat back into the cold chamber.

Moreover, even when the thermoelectric module is "off", a small forward voltage may help to prevent the back flow of heat from the heat sink to the cold chamber. While this means of blocking heat flow back through the thermoelectric module while it is turned off and dissipating it into the ambient air is described herein as relating to the present ice maker/cooler, one skilled in the art will appreciate that this technique can be advantageously applied to any thermoelectric freezer or cooler to substantially improve overall efficiency.

Also taught is a cooler further having a beverage dispensing door located proximal to the bottom of the front and wherein the liner walls are adapted to form a beverage stack. Preferably, the bottom liner wall is contoured to contact a greater surface area of a bottommost beverage container. In another preferred embodiment, the cooler has an indicator means to alert a user when only one or two beverage containers remain in the cooler. Preferable, the invention provides a can dispensing actuator located proximal to the bottom liner wall and a control arm articulating between the door and the actuator, whereby, upon opening the door, the control arm moves the actuator such that the actuator ejects a bottom beverage container and holds a second bottom beverage container within the stack. The actuator may move around a pivot point. A spring can be fitted to the door for closing the door.

BRIEF DESCRIPTION OF THE DRAWINGS

Embodiments of the invention are described by way of example with reference to the drawings in which.

DESCRIPTION OF THE PREFERRED EMBODIMENTS

Figure 1:
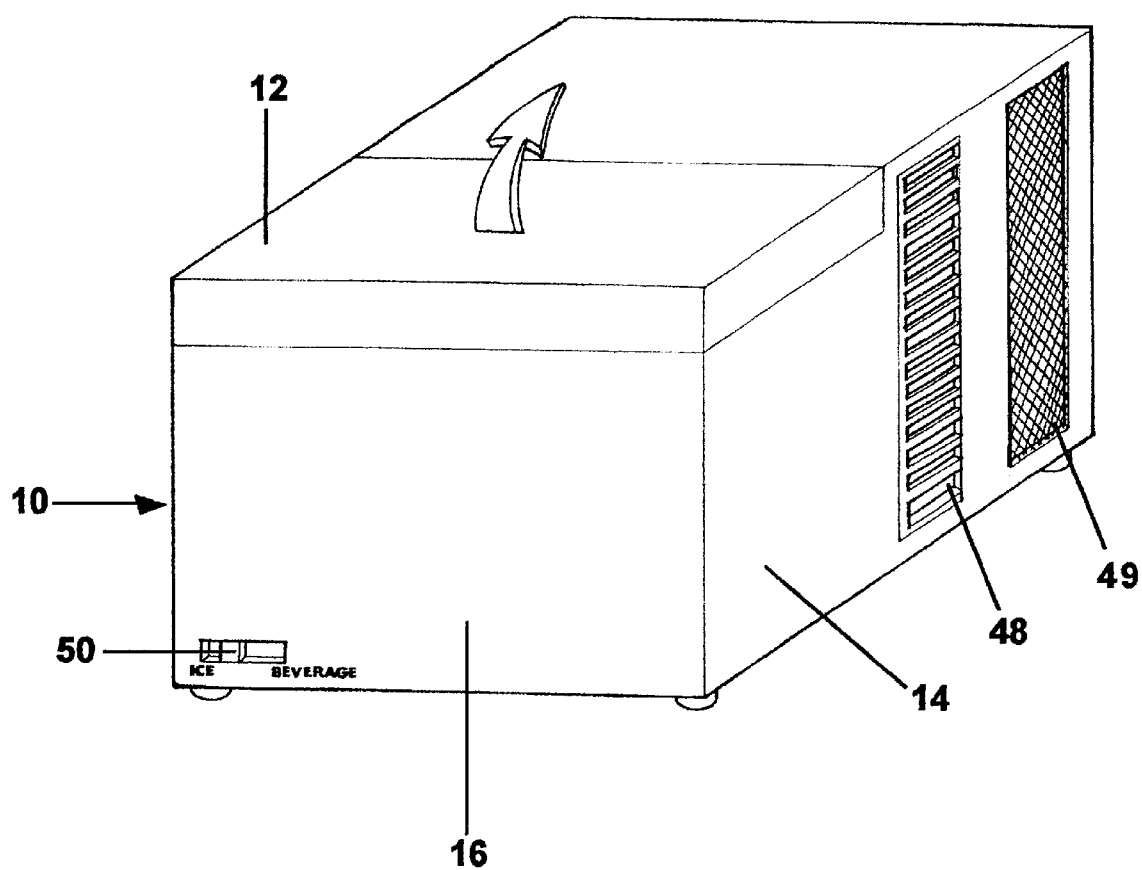
FIG. 1 is an isometric view of an ice maker/cooler according to the invention with the lid closed.

An ice maker/cooler 10 has a hinged lid 12, side walls 14, a front wall 16, a rear wall 18 and a bottom 20. The ice maker/cooler 10 may be divided into two compartments 22, 24. The front 22 being insulated on its walls and bottom. Hinged lid 12 covers compartment 22 and is, itself, insulated.

The dimensions of the ice maker/cooler 10 may be small to contain a supply of ice for one or two individuals or two or three beverage cans. For example, the height of the cooler may be in the region of 8 inches and the depth from front to back may be in the region of 10 inches. Such a small size cooler may be provided with a wall mount bracket 19 for mounting on a wall surface or it may stand on a counter top or table. Such a small size cooler also allows the possibility of mounting it within a conventional thermoelectric cooler (such as a standard sized cooler e.g. as provided by Coleman™, Igloo™ or Koolatron™) to provide a freezer compartment. Two independent thermoelectric systems may be provided or a combined thermoelectric system may be used. When a combined system is used, the cold chamber of the small freezer may be free of insulation and exposed to the interior of the insulated cooler compartment of the larger cooler. Forced or natural convection may be used to accomplish the necessary heat transfer.

The insulated, front compartment 22 may be lined with a thermally conductive liner 23 continuous over the inner wall surfaces of the insulation 26, i.e. lining the inside of the compartment over its bottom and walls. In one embodiment, the thermally conductive liner is a metal liner, and in a preferred embodiment, the metal is aluminum which should be thick enough to distribute heat (or cold) apply at any point efficiently over its whole body. The liner may be welded aluminum plates possibly ¼ inch thick to facilitate uniform heat extraction over the entire surface and maintain a relatively constant temperature throughout the front compartment 22. Other materials and thicknesses of materials may be used providing that these thermal conditions are met.

Insulation 26 may be of the rigid foam type of insulation so that it is convenient to make the partition wall 28 between front compartment 22 and rear compartment 24 only of insulation 26.

The thermoelectric module 30 may be imbedded in partition wall 28 with its heat sink face 32 directed away from compartment 22 and lying flush with the surface of partition wall 28. The load face 34 of thermoelectric module 30 may be spaced from liner 23 by a spacer block 36. The spacer block 36 is made of heat conductive material, for example aluminum and may be of a size and shape to enhance cold distribution over the whole body of the liner 23 and to allow for an acceptable level of insulation between liner 23 and the heat sink 42. Where certain materials, such as a thermoplastic, are used for cold liner 23, the area of the cold surface of the spacer block 36 may need to be increased to facilitate the same level of heat transfer. This may be accomplished by placing a larger dispersion plate between the spacer block and the cold liner 23.

The difference in surface area of the two sides of the spacer block may be accomplished by placing the dispersion plate, preferably made of the same material as the spacer block, between the spacer block and the less thermally conductive cold chamber. While this spacer block modification is described herein as it relates to the present ice maker/cooler, one skilled in the art will appreciate that such a spacer block can be applied to any other suitable thermoelectric or heat transfer apparatus known in the art, and may be particularly useful where a combination aluminum and thermal plastic apparatus is used.

A thermistor 40 is located on a wall of the liner some distance from its contact with spacer block 36, i.e. some distance from the point at which cold is actually applied to the liner 23. The distancing of thermistor 40 from spacer block 36 allows the thermistor to control the operation of thermoelectric module 30 in response to the temperature of the liner 23 at a point where the cold conduction has had an opportunity to diffuse.

A drain 37 may be provided near the base of the liner 23. The drain 32 extends from the interior of liner 23 through insulation 26 into rear compartment 24 opening, for example, between fins 42. A sponge 39 may be lodged between fins 42 to absorb condensation from drain 37. Forced convection causes evaporation of the condensate, further contributing to cooling of the heat sink.

Behind partition wall 28 formed of insulation 26 a bank of heat (or cold) conductive fins 42 is arranged projecting into rear compartment 24. The fins 42 are arranged horizontally. A surface 44 of the bank of fins 42 lies flush against the partition wall 28 in contact with the heat sink face of thermoelectric module 30. A fan 46 is located adjacent fins 42 to direct heated air from the heat sink out of compartment 24 through air flow vents 48 vertically arranged from top to bottom in the side walls of compartment 24. Baffling adjacent to fins 42 ensures heated air exits rather than remaining in compartment 24. Natural convection currents will cause some tendency of warm air between heat sink fins 42 to try to rise but such rising of warm air will not have any tendency to heat the cold chamber inside liner 23 since the fan 46 may run continuously to provide forced convection. The warm air is dissipated sideways under the influence of fan 46 to be removed from compartment 24. Cooler ambient air is drawn into compartment 24 by fan 46 through additional air vents 49 so that an efficient air circulation flow is set up.

Figure 7:
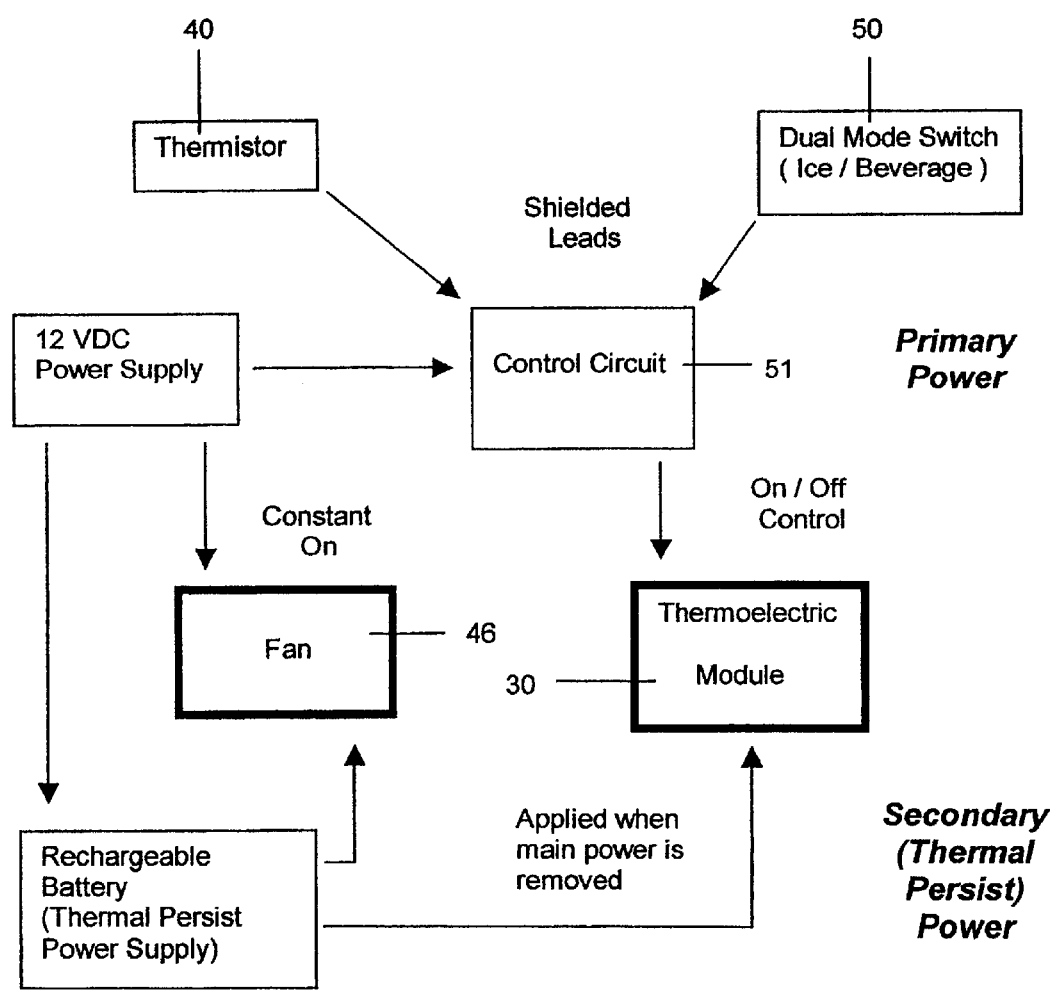
FIG. 7 is a wiring diagram showing a method for allowing the fan to run after switching off the thermoelectric element, during normal operation, and for allowing the fan and thermoelectric module operations to persist when main power is removed.

A switch 50 is provided on the front of ice maker/cooler 10 to switch the ice maker from ice making operation to beverage cooling operation. The two operations are identical with respect to cooling rates but offer two different set points, one designed to completely freeze the contents of the freezer/cooler and the other to stop short of freezing the contents of the freezer/cooler. The switch 50 is therefore connected to controller 51 which contains the switch selectable dual offset control logic, allowing the full dual mode operation using only one thermistor. The switch 50 activates the circuit shown in FIG. 7 to turn on the thermoelectric element and fan together to initiate the cooling cycle and to turn off the thermoelectric module once a set temperature has be reached.

The fan may be left on continuously to remove heat when the thermoelectric module is operating, and to further remove heat after the thermoelectric module has been turned off, thereby minimising any tendency of heat to travel back into the cold chamber. Thus the heat sink temperature is returned to ambient temperature or very close to it before the next cooling cycle begins. In certain applications it may be desirable to use a timer and/or a sensor to turn off the fan once the heat sink has fully returned to ambient temperature.

It is noted that when the thermoelectric module is switched "off", a very small voltage may be applied to the thermoelectric module as a thermal block. The application of such a small voltage may help prevent heat back tracking through the fabric of the heat sink itself. means to provide portable and persistent temporary power once main power is removed (for example, an internal rechargeable battery) is provided. In another improvement, the same power source may be used to continue fan operation subsequent to the main power supply being cut.

The controller 51 also introduces some hysteresis, allowing the container 23 to actually rise above the desired set point on a regular and controlled basis. This will allow for some melting of any frozen condensate which may form on the inside of container 23. The run-off will flow through drain hole 52 to condensate sponge 53, where it will evaporate due to air flow from fan 46. The evaporation process will further cool heat sink 42, contributing to the overall efficiency of the unit. Should the amount of frost build-up exceed the melting (or defrost) capability as described herein, then the controller can be enhanced to provide a greater amount of hysteresis and/or the controller can be enhanced to provide a defrost cycle which can be either manually or automatically initiated.

The entire unit is internally powered by 12 volt DC, meaning that it may be configured in several different modes, including but not limited to 12 volt DC supply such as in a car, truck, RV, or boat 12 volt DC supply with an external 110 volt AC to 12 volt DC converter for home or commercial use or 110 volt AC supply with an internal 110 volt AC to 12 volt DC converter for home or commercial use.

During normal operation, the 12 volt dc supply may also be used to charge an internal battery or set of batteries to prepare them for use once normal operation ceases; for example by unplugging the unit from a cigarette lighter socket in a car or boat. The charged batteries will allow the fan and thermoelectric module operations to persist in a backup mode to minimise back flow of heat and thereby maintain the contents of the cold chamber cooler over a longer period than would be otherwise possible. The running of the fan after normal operation will serve to remove heat from the heat sink through forced convection and return the heat sink temperature to or at least towards ambient temperature. A small forward voltage simultaneously applied across the thermoelectric module will aid the process of thermal persist by also inhibiting flowback of heat into the cold chamber. While this is a temporary solution in the sense that the battery power can only last a limited time, the impact on freezing temperature endurance within the chamber may be dramatic. In certain application it may be necessary to control the rate and extent of battery drain to address both these and other like considerations.

While thermal persist is described herein as it relates to the present ice maker/cooler, one skilled in the art will appreciate that it may be applied to many other thermoelectric applications to counter the natural tendency for heat to flow back through a thermoelectric module once power is removed from the device. The principle of thermal persist described herein results in controlling the flow and direction of flow in a proactive manner.

In addition, means may be provided to maintain the fan running and to apply a forward voltage across the thermoelectric module for only a set period of time after the primary power has been removed from the cooler to inhibit heat flowback.

Figure 2:
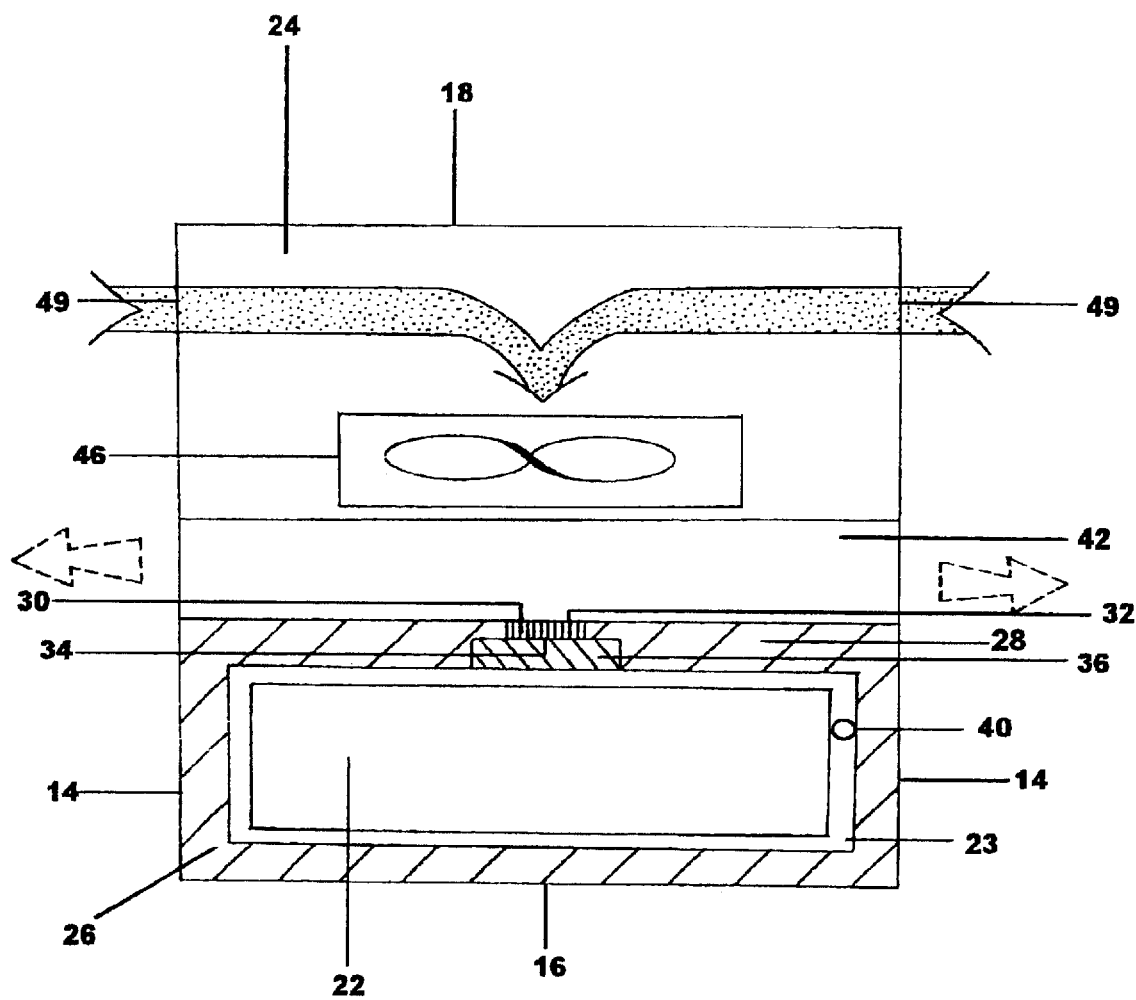
FIG. 2 is a horizontal section through the ice maker/cooler of FIG. 1.
Figure 3:
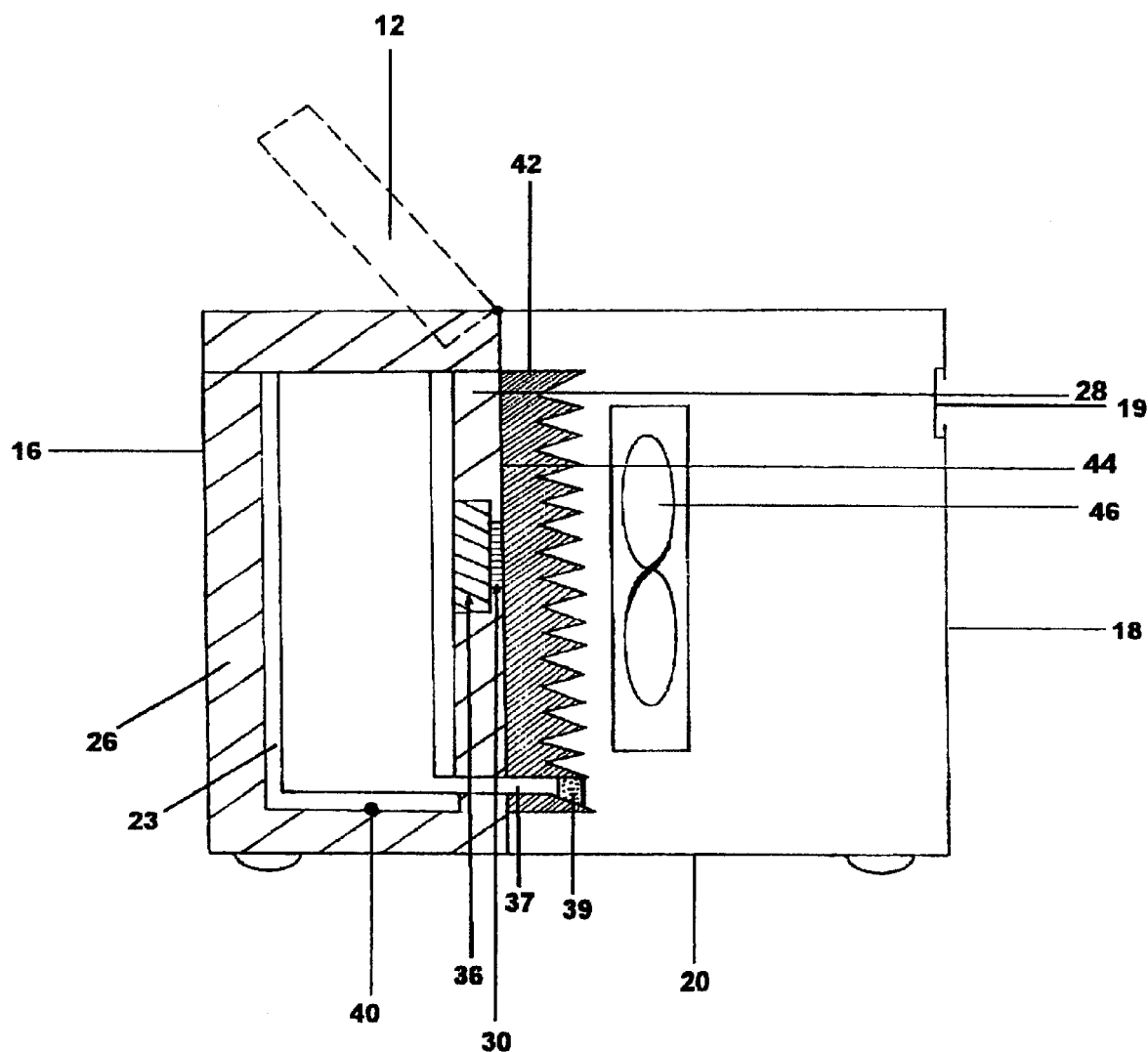
FIG. 3 is a vertical section through the ice maker/cooler of FIG. 1.
Figure 4:
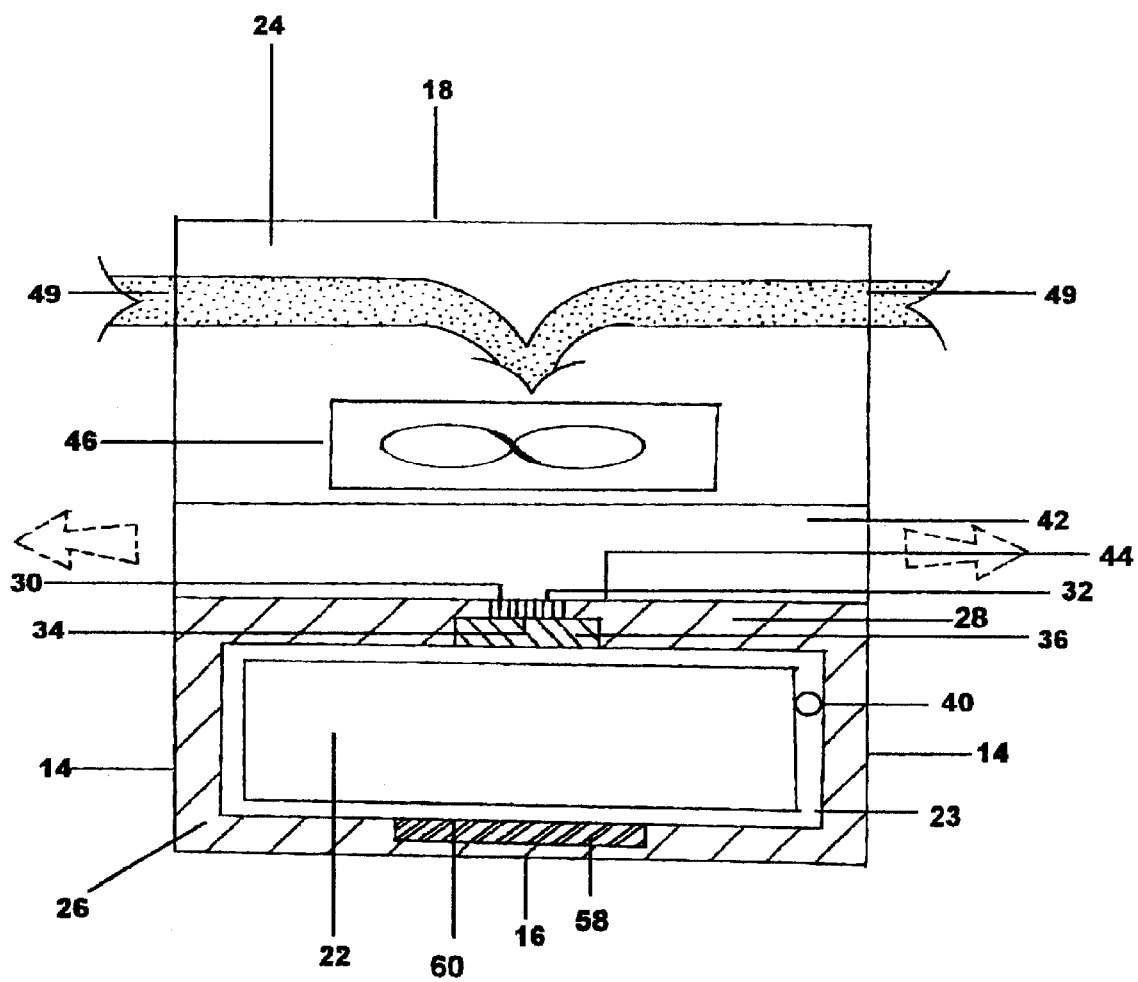
FIG. 4 is a horizontal section through another ice maker/cooler of the invention.

FIG. 4 shows a modification of the ice maker/cooler of FIG. 1–3 having as thermal ballast a block 58 of thermal gel contacting with one surface 60 over the lower surface of the of the front compartment 22. The block 58 is surrounded by insulator 26 on its other surfaces and may conveniently have dimensions of about 3"×3"×3".

Figure 5:
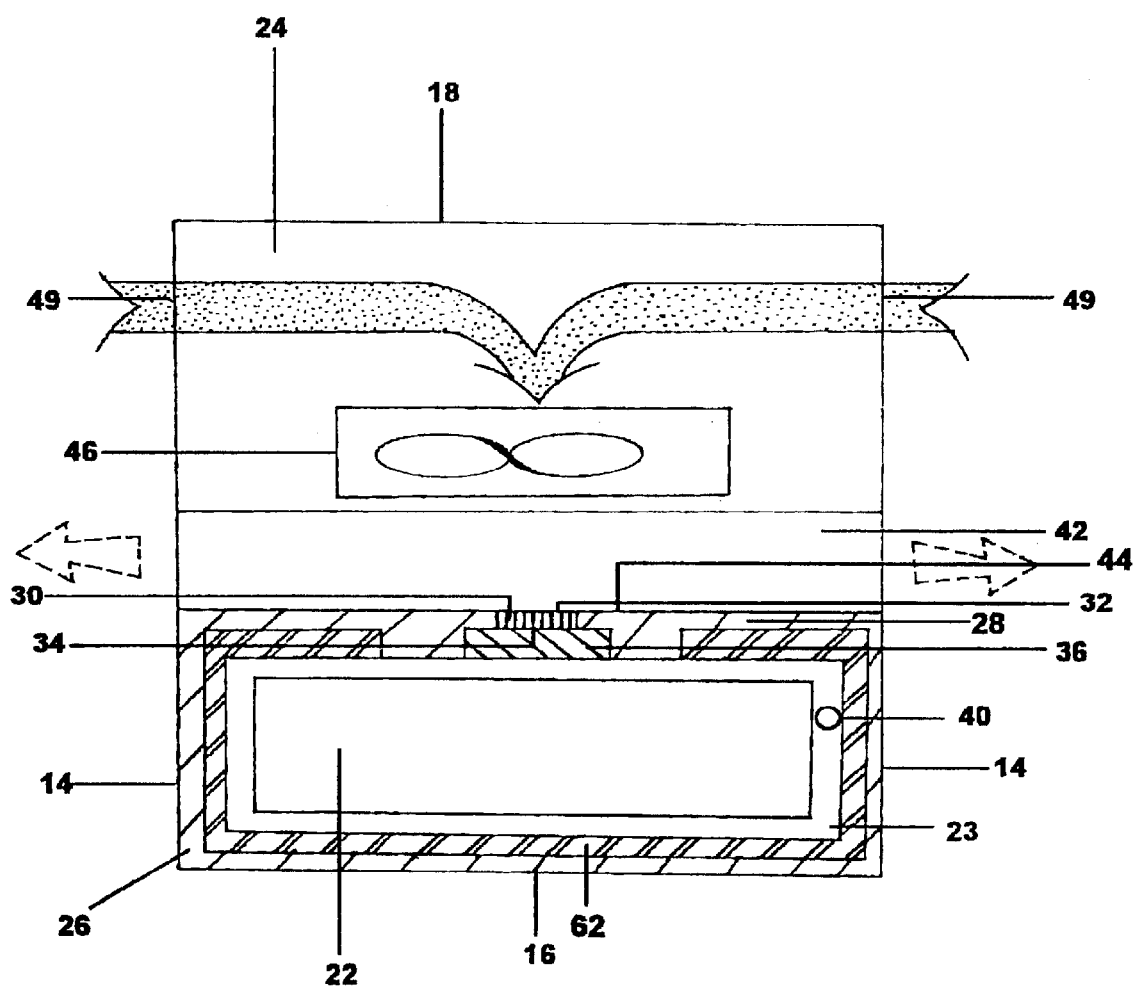
FIG. 5 is a horizontal section through yet another ice maker/cooler of the invention.
Figure 6:
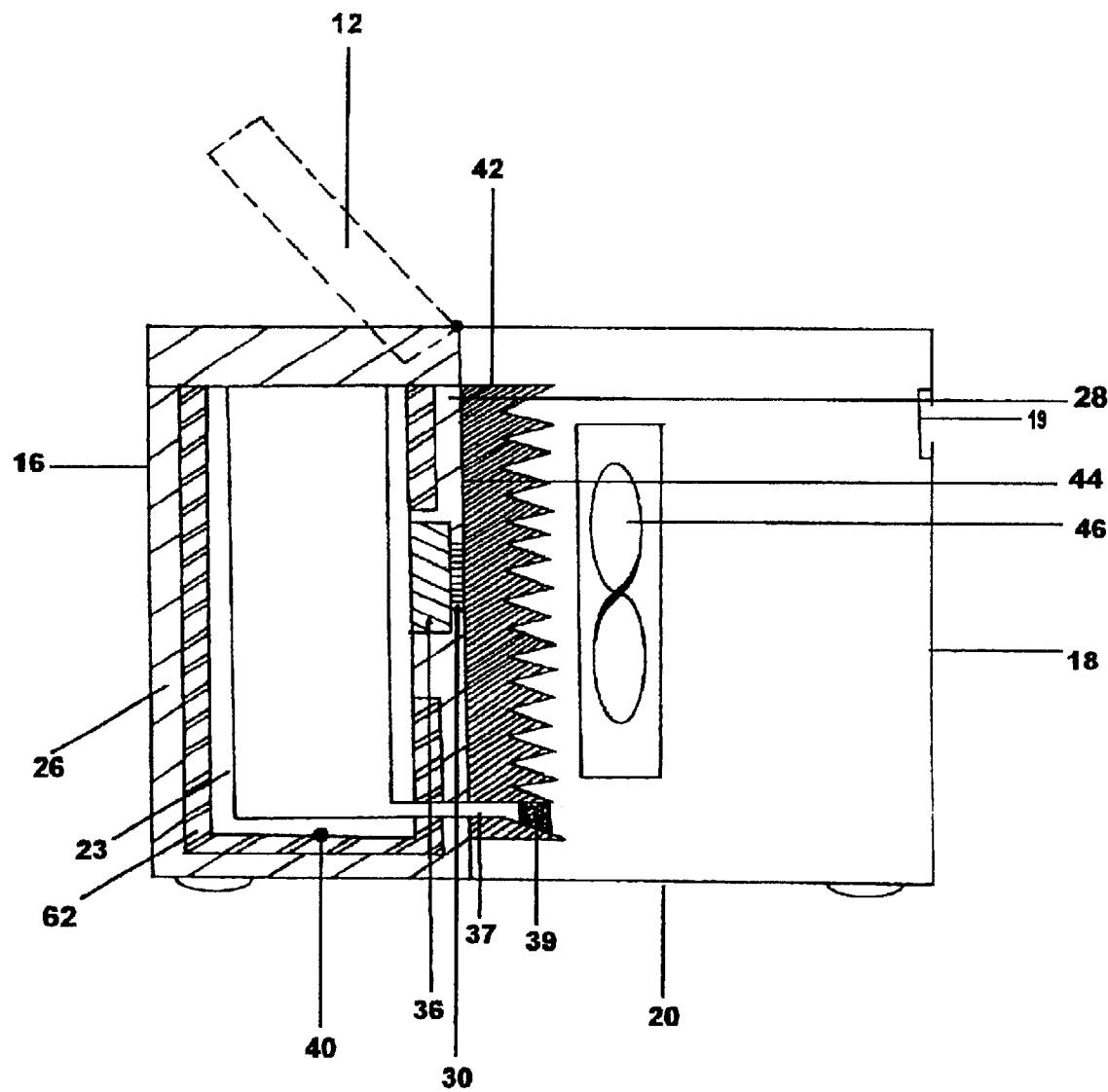
FIG. 6 is a vertical section through the ice maker/cooler of FIG. 5.

FIGS. 5 and 6 show the case where the thermal ballast is a layer 62 of thermal gel covering the walls of front compartment 22 within the insulator 26. This configuration for the thermal ballast may also improve the flow of heat around and out of the cold chamber, thereby improving efficiency as well as providing thermal ballast.

Beverage Cooler/Dispenser

Figure 8:
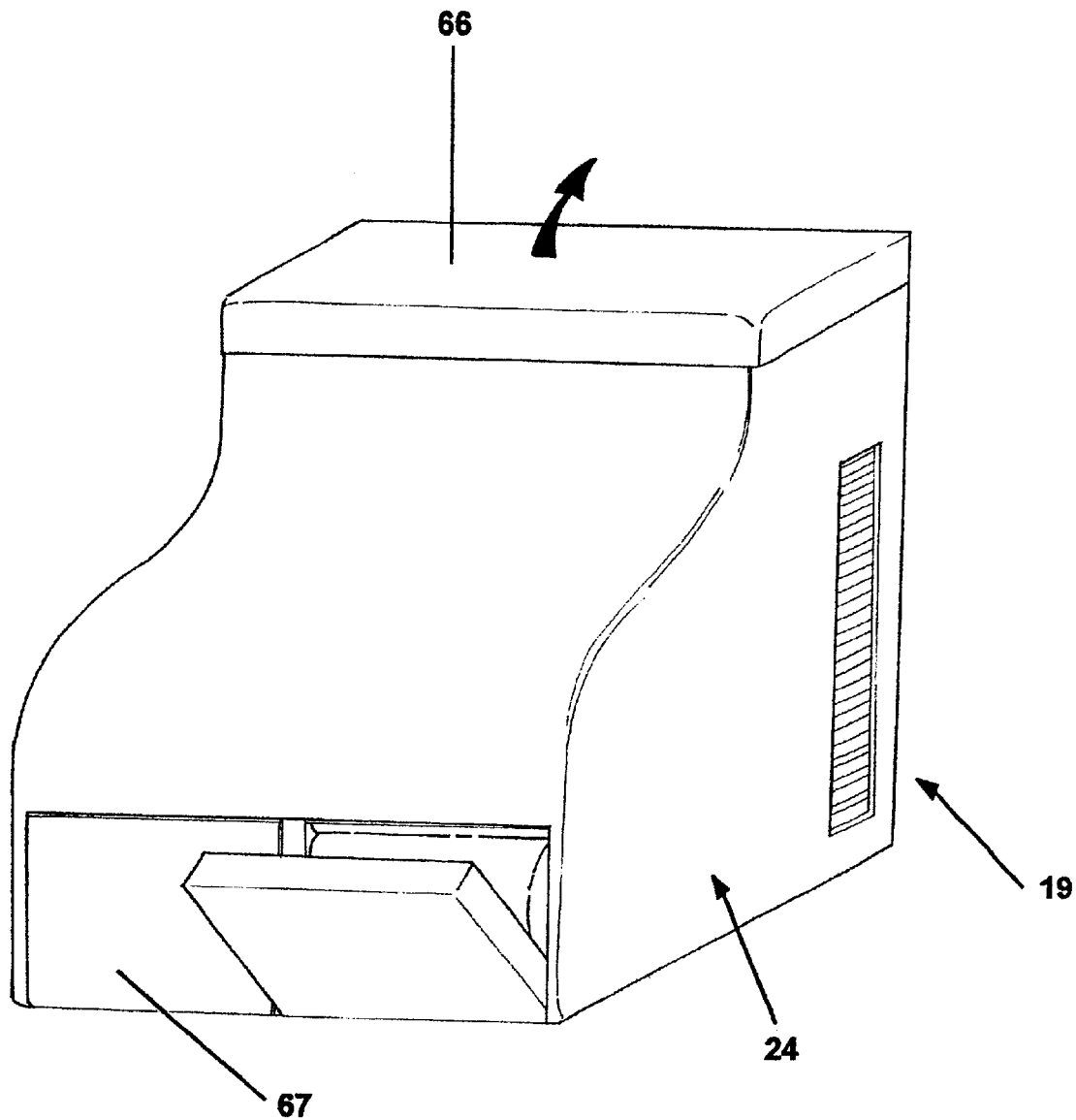
FIG. 8 is perspective view of preferred embodiment of the invention; a beverage cooler/dispenser.

The fundamental concepts behind the Combination Ice-Maker and Cooler can be successfully applied to several related products. FIG. 8 shows one example—a Beverage Cooler/Dispenser.

Figure 9:
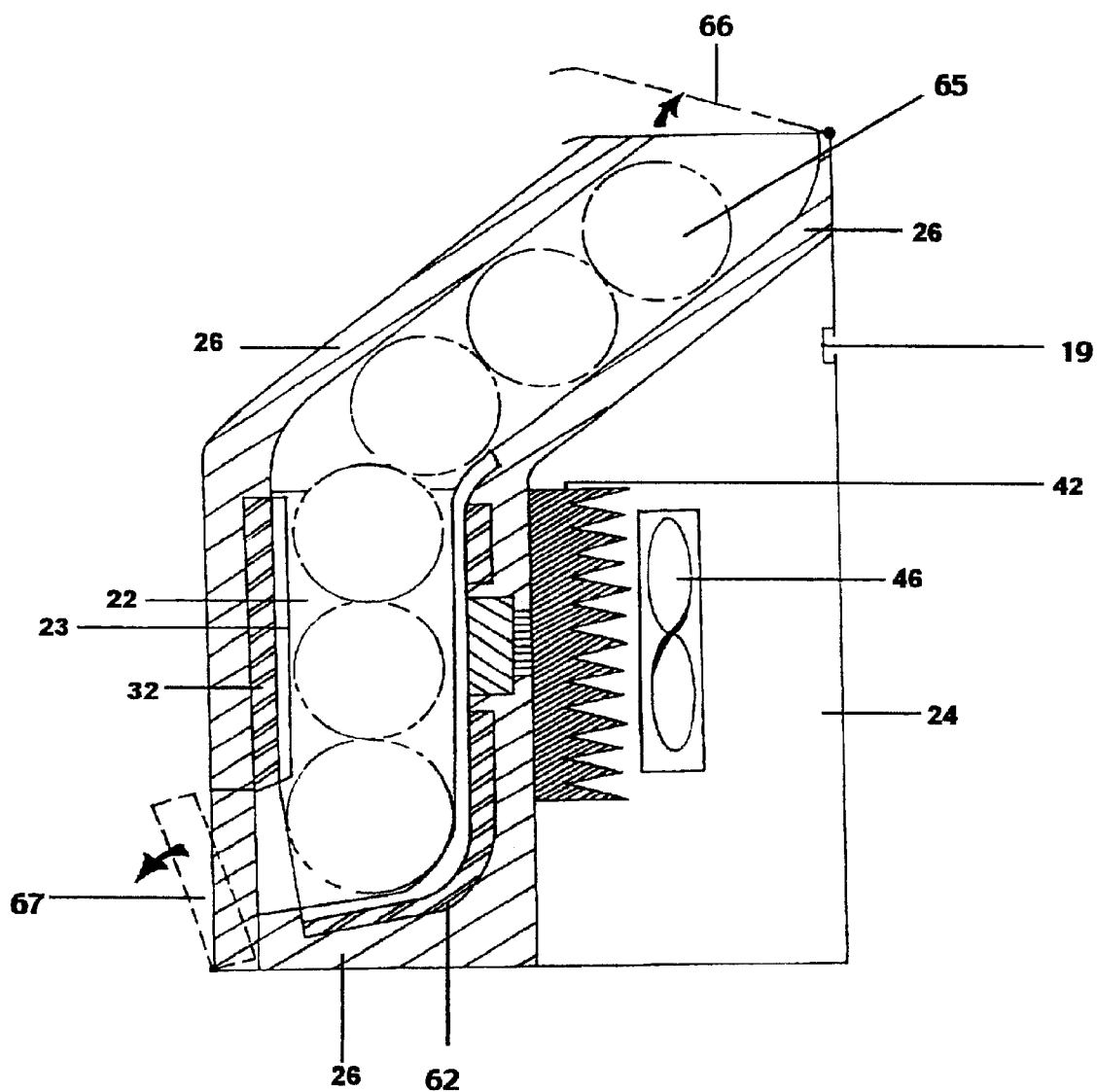
FIG. 9 is a cross-section view of the front bottom portion of the preferred embodiment of FIG. 8.

As best seen in FIG. 9, in this example, beverage cans 65 may be placed in the Beverage Cooler/Dispenser through lid 66. Up to six cans may be placed in this version of the Beverage Cooler/Dispenser, and they are retained in place until one or more cans 65 are removed through dispensing door 67. In other embodiments, the invention may allow more or less than six cans to be held in the stack, and may also allow multiple stacks of cans to facilitate different types of beverages within the same cooler.

The lower cans in the stack are held in intimate contact with thermally conductive liner 23. The liner 23 has been modified slightly by extending the bottom downward and leaving a front opening sufficiently large to allow the bottommost can to roll out freely. The back and sides of liner 23 may be extended upwards to thermally connect with a greater number of the cans to improve thermal performance, the trade-off being an increase in material cost. The modified bottom and all sides (including front and back) of liner 23 are thermally connected, and heat is removed from the liner 23 and dissipated into the ambient air through heat sink 42 with fan 46 as previously described. The bottom of liner 23 is contoured to contact a greater percentage of the bottommost can, allowing for greater efficiency of heat removal from this can. The product is designed to keep the bottommost can, i.e. the first one to be removed by the user, as the coldest can.

A layer of thermal gel 62 surrounds the liner 23 and acts as a thermal ballast. This will keep the temperature of cold compartment 22 as low as possible when new and potentially warmer cans are introduced through top lid 66. Also, the layer of insulation 26 is extended upwards to mate with lid 66, which may also be insulated, to reduce the amount of passive heat that is introduced into compartment 26 from the surrounding environment. In particular, the layer of insulation 26 that forms the bottom of cold compartment 22 in the area above the thermally conductive liner 23 serves to isolate cold compartment 22 from the much warmer rear compartment 24.

As in other embodiments of the invention, the beverage cooler/dispenser may be configured to be powered by 12V DC and/or 110V AC making it very applicable for home, office or mobile use. The unit may be placed on any flat surface, for example a counter top, table, desk or filing cabinet, or wall mounted using bracket 19.

The unit is thermostatically controlled to keep the beverages cold but above freezing. This allows the full cooling power of the unit to be applied to new and potentially warmer cans, chilling them as quickly as possible. The user adjustable thermostatic control is designed to stop the cooling action before the beverages freeze, and is further designed to set the beverage temperature according to individual taste.

Thermal persist may be implemented to keep the beverages as cool for as long as possible once power is removed from the unit. This will be particularly important for portable versions of the product.

The beverage cooler/dispenser may be further fitted with an indicator light to alert the user when only one or two cans remain inside the cooler, i.e. when it is time to add more cans. This indicator light may be connected to a sensor using available technologies, e.g. a light beam that is generally interrupted when sufficient cans are in the cooler.

It is not anticipated that the Beverage Cooler/Dispenser will exhibit a condensate problem since the condensate will simply roll out with the cans. This will actually add to consumer appeal since condensate on the cans is generally associated with a "cold and refreshing beverage". However the unit could be fitted with a condensate drain/wicking mechanism if necessary or desirable. This would require that the heat sink 42 be mounted lower and/or extended lower such that the condensate would drain into the lowest air channel, facilitating the evaporation of the condensate into the ambient air.

Figure 10:
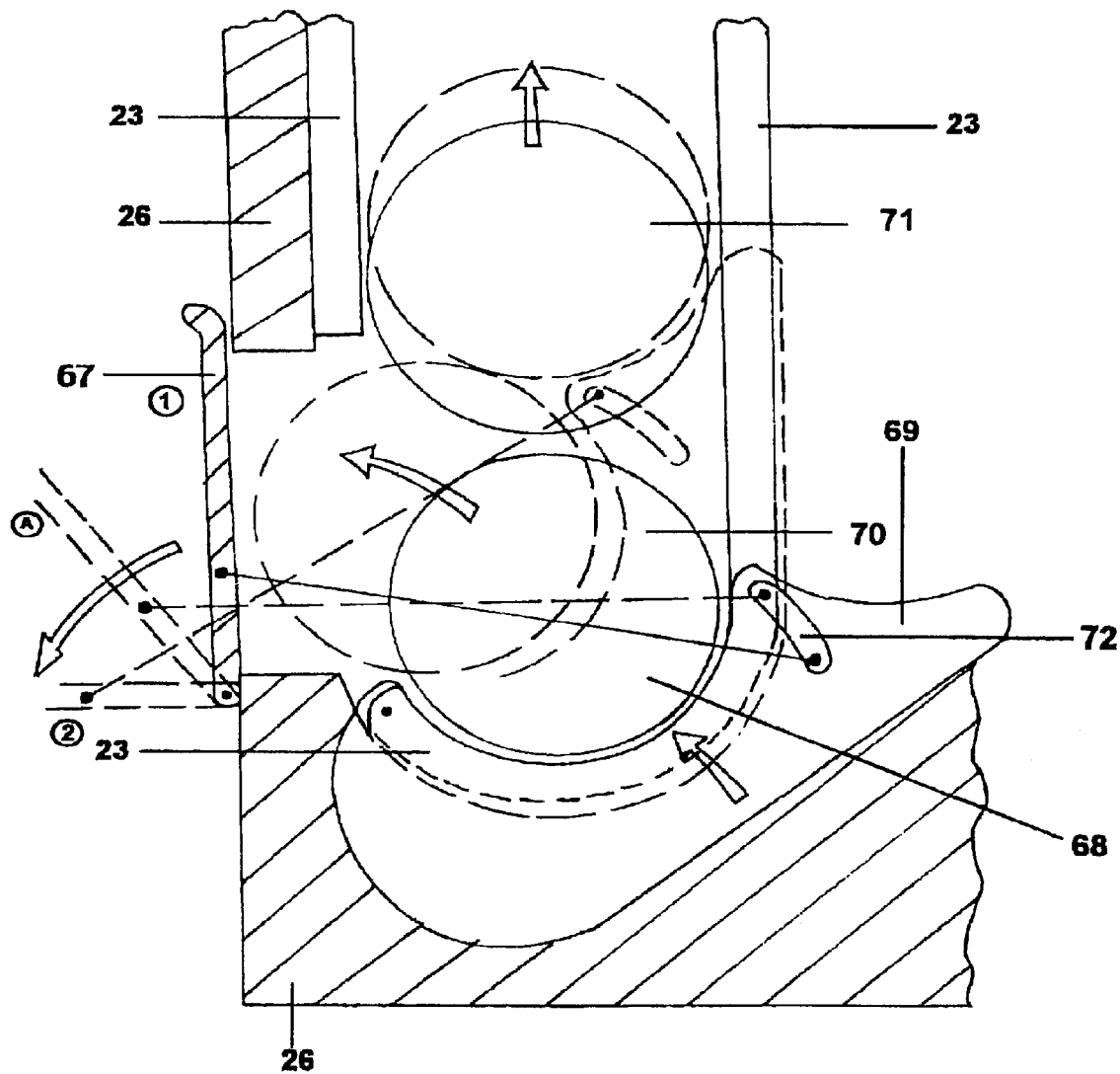
FIG. 10 is a detailed cross-section view of a single can dispensing mechanism of the preferred embodiment of FIG. 8.

FIG. 10 provides further detail regarding a potential can dispensing mechanism designed to allow a visual inspection of the can before dispensing, and then to dispense one can at a time. The cold chamber 23 and insulation 26 remain the same as in previous figures except that the bottom of cold chamber has been extended further around the bottom of can 70. The serves to hold bottom can 70 in place until it is dispensed. It also serves to provide a pivot point for can dispensing actuator 69, and to increase the thermal contact with bottom can 70.

The user will partially open front access door 67 from position 1 to 1a in order to view the next can to be dispensed. The bottom can 70 remains in place during this process. In a wider, multi-stack beverage cooler, side-by-side access doors 67 will allow the user to preview multiple bottom cans 70 before making a selection. Note that moving front access door from position 1 to 1a will move control arm 68 from one end of control slot 72 to the other end of control slot 72, but that this will not cause any movement in can dispensing actuator 69.

Upon making a selection, the user will use slightly more effort to further open front access door 67 from position 1a to 2. This causes control arm 68 to engage with and rotate can dispensing actuator 69 from position 1 through to position 2. This action lifts bottom can 70 up and over the "hump" create by the edge of cold chamber 23, and allows it to be dispensed by rolling out over the top or inside surface of front access door 67.

The can dispensing actuator 69 is shaped to simultaneously lift can 71 (and cans that may be on top of can 71) as it dispenses bottom can 70. The can dispensing actuator is designed to hold can 71 in place while bottom can 70 is being dispensed, thus allowing only one can to be dispensed at a time.

The slight lifting of can 71 (and all cans on top of can 71) provides sufficient potential energy to ensure that can dispensing actuator 69 is automatically pushed back to position 1 once the user lets go of front access door 67. The momentum created, plus the geometry of front access door 67, will ensure that it follows through to a fully close position. if necessary, a spring may be fitted to front access door 67 to ensure that it is firmly closed and does not allow any leakage of cold air from within the cold chamber 23.

Note that after dispensing bottom can 70, can 71 will index down to become the new bottom can 70. It will be held in place by the geometry of the bottom of cold chamber 23 as well as be in increased thermal contact with cold chamber 23, ensuring that it becomes as cold as possible before being dispensed. The top portion of cold chamber 23 may be notched, grooved, or otherwise modified to control the speed of the indexing process and prevent can 71 from "bouncing" as it reaches the bottom of cold chamber 23. It is likely that this modification of the top portion of cold chamber 23 may also contribute to increased thermal efficiency for the upper cans, for example by having the cans roll through a vertical "w" or a series of offset protrusions which would increase the area of contact between the cans and the cold chamber 23 as they index through each possible position on the way to the becoming bottom can 70.

We claim:

1. A compact ice maker and cooler capable of maintaining a uniform freezing or cooling temperature comprising:
   (a) a box having an insulated front compartment, an insulated front compartment lid and a heat conductive liner continuous over a bottom liner wall and front, rear and side liner walls;
   (b) a thermoelectric module for cooling the liner, the module being in thermal communication with the liner and with a heat sink to dissipate heat from the liner, the module and heat sink being located behind the liner wall, the heat sink projecting into a compartment having air vents to the exterior;
   (c) a multiple set-point controller with built-in hysteresis to control the temperature within the ice maker and cooler and to provide a defrost capability when the ice maker and cooler is operating at below freezing temperatures, and;
   (d) a thermistor to monitor operation of the thermoelectric module.

2. The ice maker and cooler as claimed in claim 1, further comprising a fan in said compartment to supplement dissipation of said heat.

3. A compact ice maker and cooler capable of maintaining a uniform freezing or cooling temperature comprising:
   (a) a box having an insulated front compartment, an insulated front compartment lid and a heat conductive liner continuous over a bottom liner wall and front, rear and side liner walls;
   (b) a thermoelectric module for cooling the liner, the module being in thermal communication with the liner and with a heat sink to dissipate heat from the liner, the module and heat sink being located behind the liner wall, the heat sink projecting into a compartment having air vents to the exterior;
   (c) a means to provide a small forward voltage after the thermoelectric module is turned off, to prevent back flow of heat from the heat sink to the cold liner; and,
   (d) a thermistor to monitor operation of the thermoelectric module.

4. The ice maker and cooler as claimed in claim 3, wherein the thermoelectric module is spaced from the wall of the liner by a spacer block, the spacer block and the module is imbedded in insulation on the wall, and sealed to prevent the ingress of condensation.

5. The ice maker and cooler as claimed in claim 3, wherein the liner is formed of ¼ inch aluminium plate or other thermally conductive material.

6. The ice maker and cooler as claimed in claim 3, further comprising insulation, and wherein the liner is located outside the cooling chamber and inside the insulation.

7. The ice maker and cooler as claimed in claim 6, wherein a thermal ballast acts as an intermediate heat sink and is placed outside the liner and inside the insulation.

8. The ice maker and cooler as claimed in claim 3, further comprising a means to maintain the fan running for a period after the thermoelectric module is turned off to dissipate heat within the heat sink to ambient.

* * * * *